US006707737B2

(12) United States Patent
Tanizaki

(10) Patent No.: US 6,707,737 B2
(45) Date of Patent: Mar. 16, 2004

(54) MEMORY SYSTEM CAPABLE OF SWITCHING BETWEEN A REFERENCE VOLTAGE FOR NORMAL OPERATION AND A REFERENCE VOLTAGE FOR BURN-IN TEST

(75) Inventor: Hiroaki Tanizaki, Tokyo (JP)

(73) Assignees: Mitsubishi Denki Kabushiki Kaisha, Tokyo (JP); Mitsubishi Electric Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/318,097

(22) Filed: Dec. 13, 2002

(65) Prior Publication Data

US 2004/0012996 A1 Jan. 22, 2004

(30) Foreign Application Priority Data

Jul. 18, 2002 (JP) ........................................ 2002-209154

(51) Int. Cl.[7] .............................................. G11C 29/00
(52) U.S. Cl. .................. 365/201; 365/189.09; 365/207; 365/208; 365/209; 365/210; 365/173; 365/171
(58) Field of Search ............................ 365/201, 189.09, 365/190, 207, 208, 209, 210, 171, 173

(56) References Cited

U.S. PATENT DOCUMENTS

| | | | | |
|---|---|---|---|---|
| 6,094,395 A | * | 7/2000 | Weinfurtner | 365/226 |
| 6,349,063 B1 | * | 2/2002 | Jibu | 365/189.11 |
| 6,501,691 B2 | * | 12/2002 | Kawamoto et al. | 365/201 |
| 2003/0081453 A1 | | 5/2003 | Hidaka | 365/173 |

FOREIGN PATENT DOCUMENTS

JP 2001-273799 10/2001

OTHER PUBLICATIONS

Roy Scheuerlein et al., "A 10ns Read and Write Non–Volatile Memory Array Using a Magnetic Tunnel Junction and FET Switch in Each Cell", ISSCC, Session 7, Feb. 2000, pp. 128–129.

Peter K. Naji et al., "A 256kb 3.0V 1T1MTJ Nonvolatile Magnetoresistive RAM", ISSCC, Session 7, Feb. 2001, pp. 122–123.

* cited by examiner

Primary Examiner—Andrew Q. Tran
(74) Attorney, Agent, or Firm—Oblon, Spivak, McClelland, Maier & Neustadt, P.C.

(57) ABSTRACT

A memory system that generates a reference voltage unaffected by supply voltage variations and is suitable for performing burn-in test is attainable by employing the following configuration. For example, in an MRAM containing a TMR element (Rij) and an N channel MOS transistor (Mij), as memory element, there is disposed a switching circuit (SW1) capable of switching between the state of applying a reference voltage (VrefN) to a memory element and the state of applying a reference voltage (VrefB) for burn-in test having a larger value than the reference voltage (VrefN) to the memory element. At the time of burn-in test, instead of the reference voltage (VrefN) for normal read operation, the reference voltage (VrefB) for burn-in test can be applied via a sense circuit (SC) to the memory element, by applying mode change signals (MODE1 to MODEn) from the exterior and operating the switching circuit (SW1) via a decode circuit (TD).

13 Claims, 12 Drawing Sheets

F I G. 1
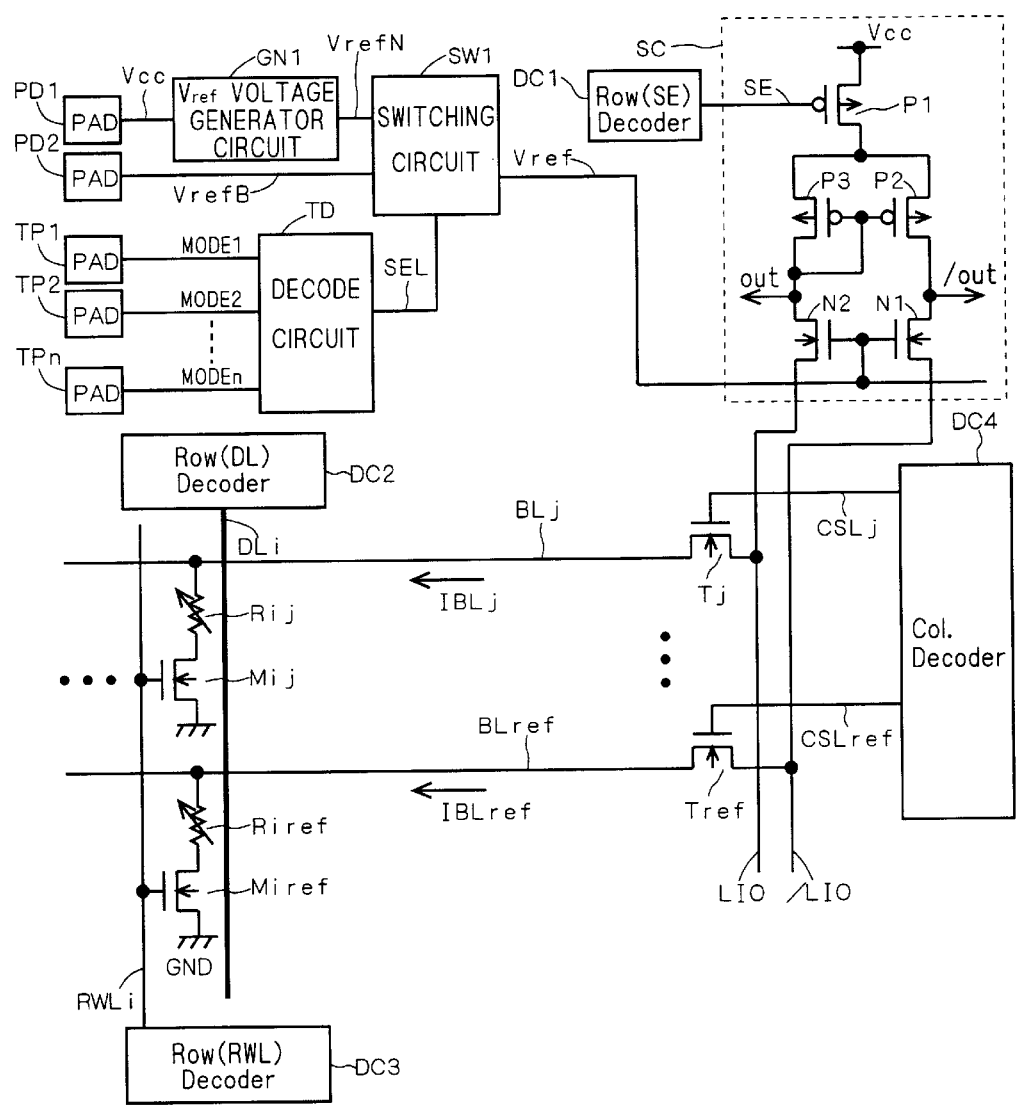

F I G. 4
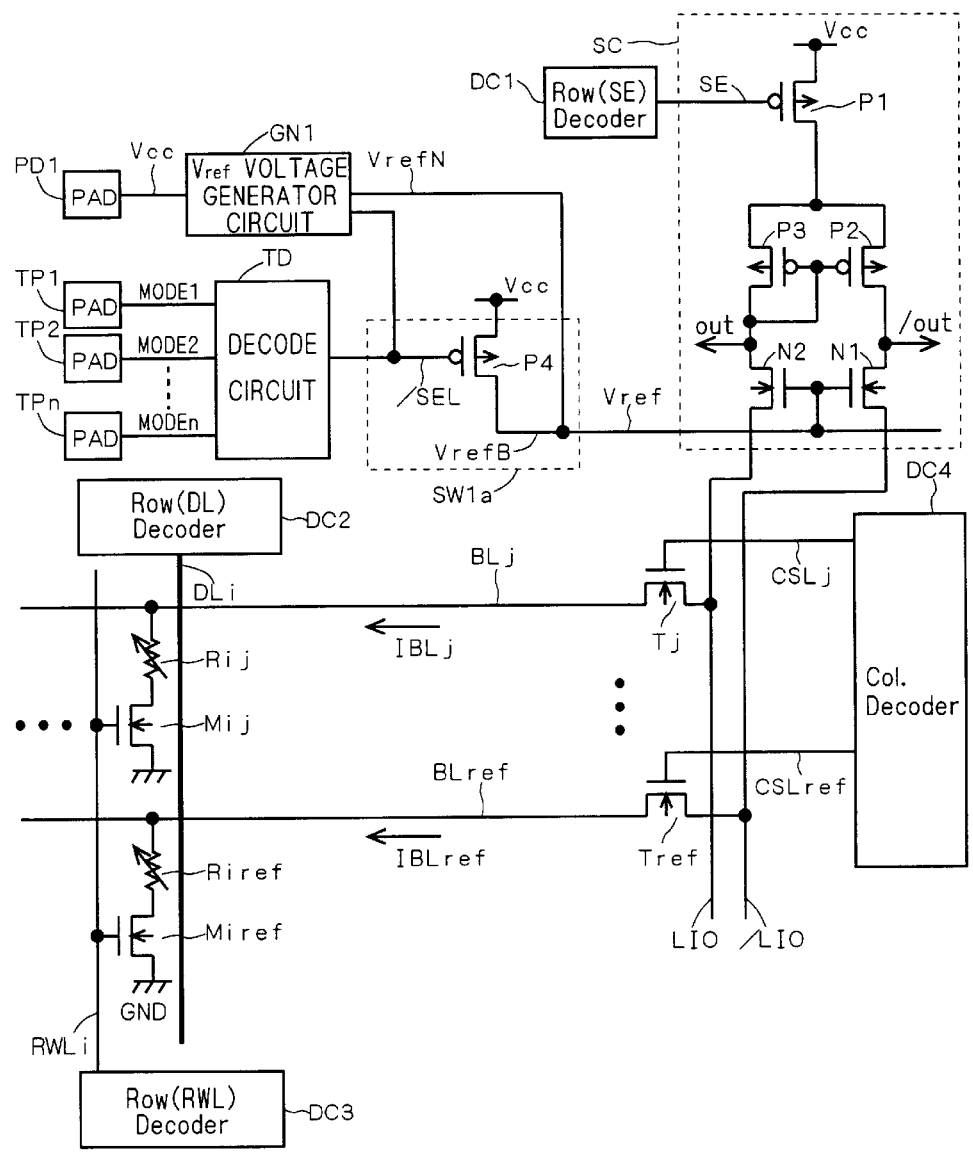

F I G. 10
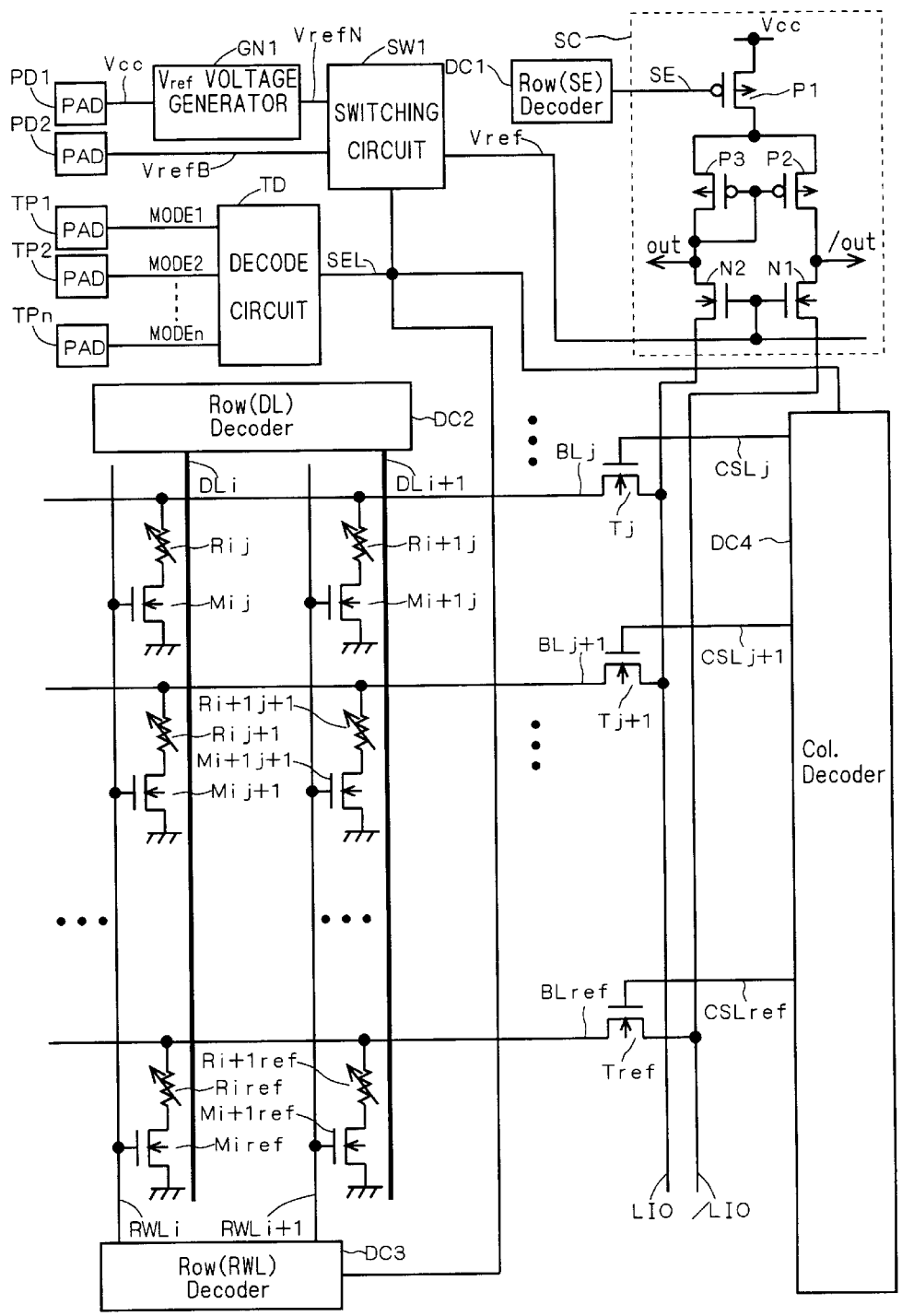

MEMORY SYSTEM CAPABLE OF SWITCHING BETWEEN A REFERENCE VOLTAGE FOR NORMAL OPERATION AND A REFERENCE VOLTAGE FOR BURN-IN TEST

BACKGROUND OF THE INVENTION

1. Field of the Invention

The present invention relates to memory systems suitable for performing burn-in test.

2. Description of the Background Art

Examples of memory systems manufactured using semiconductor techniques are DRAM (dynamic random access memory), FRAM (ferro-electric random access memory), MRAM (magnetic random access memory), etc.

Concretely, the MRAM is a memory system in which storage elements, being called TMR (tunneling magnet-resistance) elements, are used as memory elements in a memory array. The TMR element is a non-volatile memory element that has a magnetic material-insulator-magnetic material stacked structure. The magnetic materials are magnetized in a specific direction thereby to store multi-valued (e.g., binary) information.

More specifically, one of upper- and lower-layer magnetic materials in the TMR element is magnetized in a certain direction. Based on the contents of binary information to be stored for example (i.e., "0" or "1"), the other magnetic material is magnetized in a specific magnetization direction. The other magnetic material is magnetized by passing current through a digit line disposed in the vicinity of the other magnetic material from one direction to the other and vice versa. That is, this magnetization corresponds to the operation of writing information on the TMR element.

On the other hand, when a potential difference between the magnetic materials is caused to pass tunnel current throughout the stacked structure, a difference in the electric resistance of the TMR element is observed depending on the difference in the magnetization direction of the upper- and lower-layer magnetic materials. Therefore, the information can be read from the TMR element by detecting this electric resistance difference as a current signal or voltage signal.

Meanwhile, an insulating layer in the TMR element is formed so as to have an extremely small thickness that is for example equivalent to several atoms thin, in order to increase the value of tunnel current. For purpose of tunnel current generation, constant voltage is applied to the TMR element. It is preferably not too high since this would induce dielectric breakdown and damage to the TMR element.

As constant voltage usable in a memory system, there can be considered, for example, supply voltage Vcc that is applied from an external power source and used to drive the memory system. However, the value of supply voltage Vcc is usually susceptible to variations and therefore unsuitable as constant voltage applied to the TMR element. This is because a large variation would induce breakage of the TMR element.

Therefore, in the MRAM, there is usually generated reference voltage Vref having a predetermined value at which it is capable of withstanding over a predetermined range of variations in supply voltage Vcc, and this reference voltage Vref is applied to the TMR element. This reference voltage Vref is generated on a Vref voltage generator circuit disposed in the inside of the MRAM or the exterior thereof, based on supply voltage Vcc.

When performing burn-in test to a memory system, in general, the value of supply voltage Vcc is increased to expose to high temperature environment such that the deterioration of failure factor is accelerated. However, in the case that a reference voltage Vref as constant voltage is generated from supply voltage Vcc, like the MRAM, even when the value of supply voltage Vcc is increased in the burn-in test, the reference voltage Vref remaining the same as in the normal operation is merely applied to the TMR element, thereby failing to execute the burn-in test properly.

SUMMARY OF THE INVENTION

It is an object of the present invention to provide a memory system that generates reference voltage unaffected by variations in supply voltage and is suitable for performing burn-in test.

According to the present invention, a memory system includes a plurality of memory elements, voltage generator circuit, and switching means. The voltage generator circuit generates a reference voltage that is a voltage having a predetermined value used for reading information stored in the memory elements and that is unaffected by supply voltage variations over a predetermined range. The switching means is capable of switching between the state of applying the reference voltage to at least one of the memory elements and the state of applying, instead of the reference voltage, a reference voltage for burn-in test having a larger value than the reference voltage to the memory elements.

This memory system has the switching means that is capable of switching between the state of applying the reference voltage to memory elements and the state of applying, instead of the reference voltage, a reference voltage for burn-in test having a larger value than the reference voltage to the memory elements. Therefore, by operating the switching means, instead of the reference voltage for normal read operation, the reference voltage for burn-in test can be applied to a memory element at the time of burn-in test. That is, even with a memory system in which reference voltage is generated, it is possible to implement a memory system suitable for performing burn-in test.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing a memory system according to a first preferred embodiment of the invention;

FIG. 4 is a diagram showing a memory system according to a second preferred embodiment of the invention;

FIG. 10 is a diagram showing a memory system according to a sixth preferred embodiment of the invention;

DESCRIPTION OF THE PREFERRED EMBODIMENTS

First Preferred Embodiment

Figure 2:
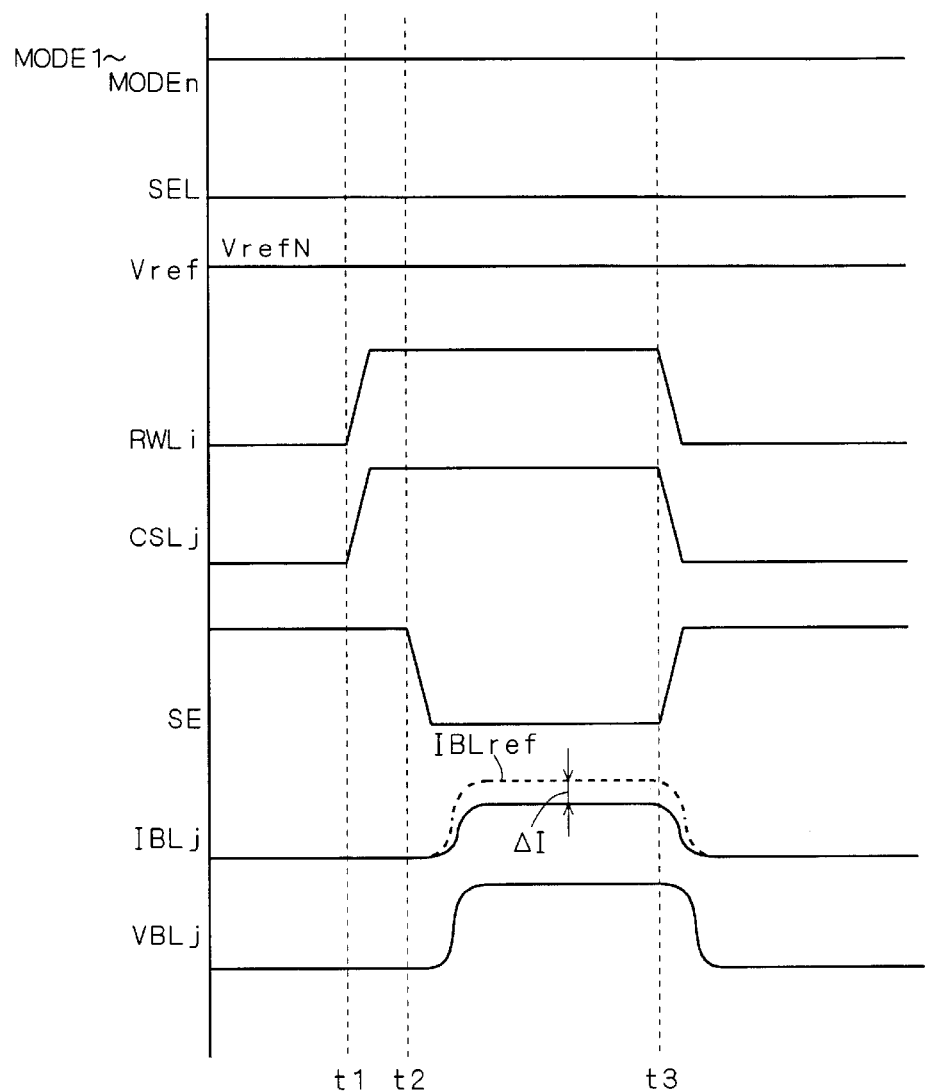
FIG. 2 is a timing chart at the time of normal read operation in the memory system of the first preferred embodiment.

A first preferred embodiment of the present invention is directed to a memory system that is an MRAM including a sense circuit. This memory system has a switching circuit that can switch between the state of applying a reference voltage to a memory element and the state of applying a reference voltage for burn-in test that has a larger value than the former reference voltage. Therefore, in place of the reference voltage used at the normal read operation, the reference voltage for burn-in test can be applied to the memory element at the time of burn-in test by operating the switching circuit. That is, it is capable of implementing a memory system suitable for performing burn-in test although the reference voltage is generated in the memory system.

FIG. 1 is a diagram showing a memory system according to the first preferred embodiment. Referring to FIG. 1, this memory system comprises a sense circuit SC and a memory array in which a plurality of memory elements are disposed in an array.

The sense circuit SC has P channel MOS transistors P1 to P3, and N channel MOS transistors N1 and N2. The P channel MOS transistors P2 and P3 are connected to each other at their sources and gates, and the gate and drain of the P channel MOS transistor P3 are short-circuited. That is, the P channel MOS transistors P2 and P3 form a current mirror circuit.

The drain of the P channel MOS transistor P1 is connected to the sources of the P channel MOS transistors P2 and P3. Supply voltage Vcc for driving the memory system is applied to the source of the P channel MOS transistor P1. A control signal SE from a row decoder DC1 for sense circuit drive is inputted to the gate of the P channel MOS transistor P1.

The drain of the N channel MOS transistor N1 is connected to the drain of the P channel MOS transistor P2. The drain of the N channel MOS transistor N2 is connected to the drain of the P channel MOS transistor P3. Their connection nodes function as fetch points of voltage signals "/out" and "out", respectively (the symbol "/" used in the specification denotes a logical inversion signal).

The gates of the N channel MOS transistors N1 and N2 are connected to each other. A signal line /LIO is connected to the source of the N channel transistor N1 and a signal line LIO is connected to the source of the N channel MOS transistor N2. The drain of MOS transistor Tref is connected to the signal line /LIO, and the drain of N channel MOS transistor Tj is connected to the signal line LIO.

Each of the memory elements in the memory array is composed of a TMR element Rij and an N channel MOS transistor Mij. In the reference characters "Tj", "Rij", and "Mij", the subscripts "i" and "j" are positive integers and denote "row" and "column", respectively.

Following is the configuration of connections in the memory elements. One end of the TMR element Rij is connected to the drain of the N channel MOS transistor Mij, and a ground potential GND is applied to the source of the N channel MOS transistor Mij. The gate of the N channel MOS transistor Mij is connected to a read word line RWLi. A read row decoder DC3 controls the potential of the read word line RWLi.

A bit line BLj is connected to the other end of the TMR element Rij. The bit line BLj is connected to the source of the N channel MOS transistor Tj. The gate of the N channel MOS transistor Tj is connected to a column selection line CSLj. A column decoder DC 4 controls the potential of the column selection line CSLj.

The memory array has a reference memory element composed of a reference TMR element Riref and a reference N channel MOS transistor Miref. One end of the reference TMR element Riref is connected to the drain of the reference N channel MOS transistor Miref, and a ground potential GND is applied to the source of the reference N channel MOS transistor Miref. The gate of the reference N channel MOS transistor Miref is connected to the read word line RWLi.

A reference bit line BLref is connected to the other end of the reference TMR element Riref. The reference bit line BLref is connected to the source to the N channel MOS transistor Tref. The gate of the N channel MOS transistor Tref is connected to a reference column selection line CSLref. The column decoder DC4 controls the potential of the reference column selection line CSLref.

A digit line DLi for magnetizing the TMR elements is disposed in the vicinity of the TMR element Rij and reference TMR element Riref. A write row decoder DC2 controls the potential of the digit line DLi.

Referring again to FIG. 1, the memory system of the first preferred embodiment further comprises a Vref voltage generator circuit GN1, switching circuit SW1, and decode circuit TD. Supply voltage Vcc is applied via a pad PD1 to the Vref voltage generator circuit GN1. Based on the supply voltage Vcc, the Vref voltage generator circuit GN1 generates a reference voltage VrefN that is used in the normal read operation of multi-valued information stored in the memory elements including the TMR element Rij.

Mode change signals MODE1 to MODEn are applied via pad TP1 to TPn (n is a positive integer) to the decode circuit TD. The mode change signals MODE1, MODE2, . . . , and MODEn are respectively a 1-bit signal. The decode circuit TD composed of a plurality of logic circuits generates and outputs a predetermined control signal SEL, according to the logical value combination of the contents of the mode change signals MODE1 to MODEn, respectively.

To the switching circuit WS1, there is applied (i) reference voltage VrefN generated by the Vref voltage generator circuit GN1; (ii) reference voltage VrefB for burn-in test via a pad PD2; and (iii) a control signal SEL. Then, the switching circuit SW1 outputs either the reference voltage VrefN or reference voltage VrefB for burn-in test, according to the contents of the control signal SEL. The control signal SEL will be described later.

Description will now be made of the operation of the memory system of the first preferred embodiment. Firstly, as the usual MRAM operation, the TMR element is magnetized to execute write operation. Referring to FIG. 1, current passes through the digit line DLi, and current IBLj passes through the bit line BLj, thereby magnetizing the both magnetic materials of the TMR element Rij locating at the intersection between the digit line DLi and bit line BLj. At this time, depending on the direction of the current IBLj passing through the bit line BLj, the magnetization direction of one of the magnetic materials of the TMR element Rij varies. This appears as difference in the electric resistance of the TMR element Rij.

At the time of write operation, the N channel MOS transistor Mij enters the off state, so that no tunnel current passes through the TMR element Rij. That is, at the time of write operation, it is impossible to perform burn-in test in which current is passed through the TMR element Rij.

Following is the read operation of the MRAM. At the time of read operation, the read row decoder DC3 designates a row address and the potential of the read word line RWLi becomes "Hi". Thereby, the N channel MOS transistor Mij enters the on state. The column decoder DC4 designates a column address and the potential of the column selection line CSLj becomes "Hi". Thereby, the N channel MOS transistor Tj enters the on state, and the bit line BLj is selected.

Through the foregoing operations, there is established the state that it is able to read the electric resistance value of the TMR element Rij locating at the intersection between the read word line RWLi and bit line BLj. That is, there is established the state that it is able to read the multi-valued information stored in the memory element at the intersection therebetween.

The sense circuit SC reads the electric resistance value of each TMR element. At this time, the read operation of accuracy is achieved by comparison with a reference electric resistance value.

The electric resistance value of each TMR element falls within the range of between a maximum resistance value Rmax and a minimum resistance value Rmin. Therefore, the reference TMR element Riref having a median electric resistance value between the maximum resistance value Rmax and the minimum resistance value Rmin is disposed in the memory array. The sense circuit SC judges the information stored in the TMR element Rij by comparing the electric resistance value of the selected TMR element Rij and that of the reference TMR element Riref.

Accordingly, at the time of reading, there is established the state that the electric resistance value of the reference TMR element Riref can also be read, as in the case with the electric resistance value of the TMR element Rij. That is, when the potential of the read word line RWLi becomes "Hi", the reference N channel MOS transistor Miref also enters the on state. The column decoder DC4 designates a reference column address and the potential of the reference column selection line CSLref becomes "Hi". Thereby, the N channel MOS transistor Tref enters the on state, and the reference bit line BLref is selected.

When reading the electric resistance values of the TMR element Rij and reference TMR element Riref, constant voltage is applied to the bit line BLj and reference bit line BLref. This application of constant voltage passes currents IBLj and IBLref through the TMR element Rij and reference TMR element Riref, respectively. The sense circuit SC reads a difference in the current amount so as to detect whether the electric resistance of the TMR element Rij is high or low.

The application of constant voltage to the bit line BLj and reference bit line BLref is executed by the sense circuit SC. That is, when a control signal SE is applied from the row decoder DC1 for sense circuit drive, the P channel MOS transistor P1 in the sense circuit SC enters the on state, and the current mirror circuit composed of the P channel MOS transistors P2 and P3 is driven. Thereby, the same current passes through the respective drains of the P channel MOS transistors P2 and P3.

By applying signal Vref as constant voltage having a predetermined value to the gates of the N channel MOS transistors N1 and N2, both transistors enter the on state and the current from the P channel MOS transistors P2 and P3 pass through the signal lines /LIO and LIO. In this occasion, if N channel MOS transistors Tj and Tref are in the on state and the bit line BLj and reference bit line BLref are selected, current passes through the memory element and reference memory element.

Since the TMR element Rij and reference TMR element Riref have different electric resistance values, the currents IBLj and IBLref passing therethrough have different values. These values are converted by the sense circuit SC and appear as voltage signals "/out" and "out", thereby reading the multi-valued information stored in the memory element.

A threshold voltage Vth between the gate and source is present in the each N channel MOS transistors N1 and N2. Therefore, the voltage applied to the reference memory element is given by the strict expression of (Vref−Vth). In addition, the current passing between the drain and source of the N channel MOS transistor N2 varies depending on the electric resistance value of each memory element. This variation appears as variation Vmc in the voltage between the gate and source of the N channel MOS transistor N2. Therefore, the voltage applied to each memory element is given by the strict expression of (Vref−Vth−Vmc).

During this read operation, the N channel MOS transistor Mij is in the on state, and the tunnel current passes through the TMR element Rij. Therefore, it is possible to perform burn-in test by increasing the constant voltage applied to the bit line BLj and reference bit line BLref so as to increase the tunnel current value.

It will be recalled that the reference voltage Vref is employed as constant voltage applied to TMR element in the MRAM, as stated above. Accordingly, even when the supply voltage Vcc is increased in burn-in test, the reference voltage Vref is merely applied to the TMR element, thus failing to carry out the burn-in test properly.

To overcome this, the present invention has a switching means that can switch the state of applying the normal reference voltage VrefN to a memory element at the time of normal read operation, and the state of applying reference voltage VrefB for burn-in test having a larger value than the reference voltage VrefN at the time of burn-in test.

With this switching means, in place of the reference voltage for normal read operation, the reference voltage for burn-in test can be applied to the memory element at the time of burn-in test. Specifically, a memory system suitable for burn-in test can be implemented although the reference voltage is generated therein.

In the memory system of FIG. 1, this switching means is formed by the switching circuit SW1 and decode circuit TD. The decode circuit TD activates or deactivates the control signal SEL, according to the logic value combination of the contents of the mode change signals MODE1 to MODEn that are applied via pads TP1 to TPn, respectively.

Concretely, the control signal SEL is for example a binary signal of "Hi" or "Low". If the logic value combination of the mode change signals MODE1 to MODEn indicates the normal read mode, the decode circuit TD deactivates the control signal SEL (e.g., it is set to "Low"), such that the switching circuit SW1 outputs the reference voltage VrefN as signal Vref.

On the other hand, if the logic value combination of the mode change signals MODE1 to MODEn indicates burn-in test mode, the decode circuit TD activates the control signal SEL (e.g., it is set to "Hi"), such that the switching circuit SW1 outputs the reference voltage VrefB for burn-in test as signal Vref.

The reason for inputting the mode change signals by the amount of a plurality of bits is to consider modes other than the burn-in test mode and normal read mode. If there is only the burn-in test mode and normal read mode, for example, it may be configured such that the decode circuit TD is eliminated and only the mode change signal MODE1 is inputted from the pad TP1 and then applied to the switching circuit SW1 as a control signal SEL.

FIG. 2 shows a timing chart of the normal read operation in the memory system of the first preferred embodiment. When the logic value combination of the mode change signals MODE1 to MODEn indicates the normal read mode, the control signal SE outputted from the decode circuit TD is "Low." Thereby, the switching circuit SW1 selects the reference voltage VrefN and outputs it as signal Vref to the sense circuit SC.

Based on the address signal inputted from the exterior, at time t1, the read row decoder DC3 and column decoder DC4 set the potentials of the read word line RWLi and column selection line CSLj to "Hi", respectively. Thereby, a memory element locating at the intersection between the read word line RWLi and column selection line CSLj is selected.

At time t2, the row decoder DC1 for sense circuit drive sets the control signal SE to "Low" ("Low-active") and the P channel MOS transistor P1 to the on state. Thereby, the sense circuit SC is driven to pass current through the signal lines LIO and /LIO. Then, as voltages VBLj and VBLref, the reference voltage VrefN (strictly, (VrefN−Vth−Vmc) and (VrefN−Vth)) is applied to the bit lines BLj and BLref, so that currents IBLj and IBLref pass through the bit lines BLj and BLref, respectively.

The sense circuit SC converts difference AI between the currents IBLj and IBLref to a difference between the voltage values of the voltage signals "out" and "/out", and outputs the result. Thereby, the information stored in the memory element can be read.

At time t3, the read row decoder DC3 and column decoder DC4 set the potentials of the read word line RWLi and column selection line CSLj to "Low", respectively. Then, the row decoder DC1 for sense circuit drive sets the control signal SE to "Hi" and the P channel MOS transistor P1 to the off state.

Figure 3:
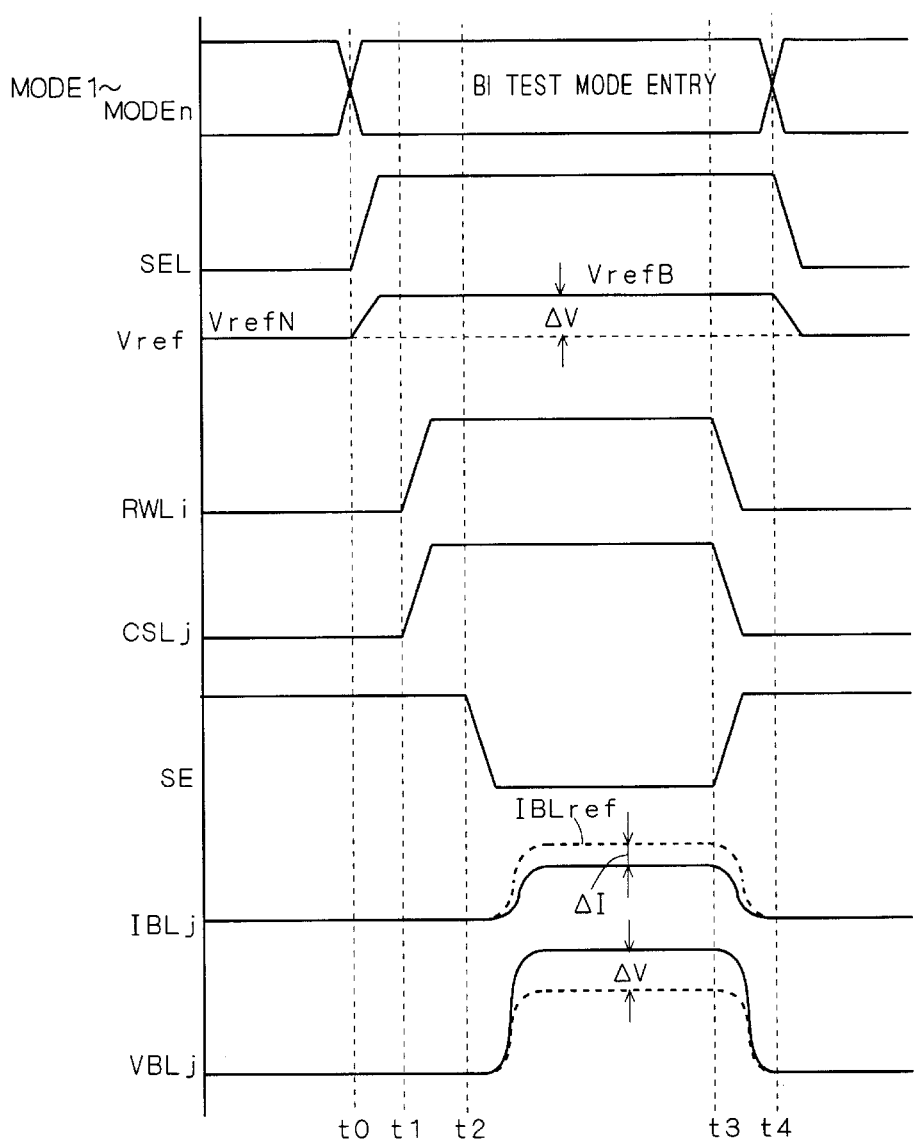
FIG. 3 is a timing chart at the time of burn-in test in the memory system of the first preferred embodiment.

FIG. 3 is a timing chart of the burn-in test operation in the memory system of the first preferred embodiment. At time t0, when the logic value combination of the mode change signals MODE1 to MODEn indicates burn-in test mode, the control signal SEL outputted from the decode circuit TD becomes "Hi". Thereby, the switching circuit SW1 selects a reference voltage VrefB for burn-in test that is higher than the reference voltage VrefN by the amount of ΔV, and outputs it as signal Vref to the sense circuit SC.

Based on the address signal inputted from the exterior, at time t1, the read row decoder DC3 and column decoder DC4 set the potentials of the read word line RWLi and column selection line CSLj to "Hi", respectively. As the result, a memory element locating at the intersection between the read word line RWLi and column selection line CSLj is selected.

At time t2, the row decoder DC1 for sense circuit drive sets the control signal SE to "Low" and the P channel MOS transistor P1 to the on state. Thereby, the sense circuit SC is driven to pass current through the signal lines LIO and /LIO. Then, as voltages VBLj and VBLref, the reference voltage VrefB for burn-in test (strictly, (VrefB−Vth−Vmc) and (VrefB−Vth) as described above) is applied to the bit lines BLj and BLref, so that currents IBLj and IBLref are passed through the bit lines BLj and BLref, respectively.

At this time, the reference voltage VrefB for burn-in test that is higher than the reference voltage VrefN for normal reading by the amount of ΔV is applied to the memory element and reference memory element. It is therefore possible to properly perform burn-in test.

Then, the sense circuit SC converts difference ΔI between the currents IBLj and IBLref to a difference between the voltage signals "out" and "/out" and outputs this difference. Thereby, the information stored in the memory element can be read. Under the burn-in test, the information reading is monitored to specify a defective location.

At time t3, the read row decoder DC3 and column decoder DC4 set the potentials of the read word line RWLi and column selection line CSLj to "Low", respectively. Then, the row decoder DC1 for sense circuit drive sets the control signal SE to "Hi" and the P channel MOS transistor P1 to the off state.

At time t4, when the logic value combination of the mode change signals MODE1 to MODEn indicates the termination of the burn-in test, the control signal SEL outputted from the decode circuit TD returns to "Low." Thereby, the switching circuit SW1 selects the reference voltage VrefN, instead of the reference voltage VrefB for burn-in test.

With the memory system of the first preferred embodiment, the switching means composed of the switching circuit SW1 and decode circuit TD can switch between the state of applying the reference voltage VrefN to the memory element and the state of applying, instead of the reference voltage VrefN, the reference voltage VrefB for burn-in test that has a larger value than the reference voltage VrefN.

Therefore, by operating the switching circuit, in place of the reference voltage for normal read operation, the reference voltage for burn-in test can be applied to the memory element at the time of burn-in test. That is, it is capable of implementing a memory system suitable for performing burn-in test although the reference voltage is generated in the memory system.

In addition, the switching means includes the switching circuit SW1 that receives as inputs the reference voltage VrefN and reference voltage VrefB for burn-in test and that outputs either of them based on the contents of the control signal SEL. Therefore, merely by applying the control signal SEL, it is possible to apply the reference voltage VrefN to the memory element at the time of read operation, and the reference voltage VrefB for burn-in test can be applied to the memory element at the time of burn-in test.

Further, the memory system of the first preferred embodiment has the sense circuit SC for reading multi-valued information stored in the memory element. The reference voltage VrefN and reference voltage VrefB for burn-in test are applied via the sense circuit SC to the memory element. Receiving the reference voltage VrefN and reference voltage VrefB for burn-in test, the memory element generates the current signals IBLj and IBLref. Based on the current signals IBLj and IBLref, the sense circuit SC reads the multi-valued information stored in the memory element.

With the above configuration, a memory system suitable for performing burn-in test can be implemented in such a memory system such as an MRAM, including a memory element of a type which generates a current signal, such as a TMR element.

Second Preferred Embodiment

A second preferred embodiment of the invention is a modification of the memory system of the first preferred embodiment and has the following characteristic features that the switching circuit SW1 is composed of a transistor and that supply voltage Vcc is used as the reference voltage VrefB for burn-in test.

FIG. 4 is a diagram showing a memory system according to the second preferred embodiment. Referring to FIG. 4, this memory system is different from that of the first preferred embodiment in the points that: the reference voltage VrefB for burn-in test is eliminated; a P channel MOS transistor P4 is added; and the control signal SEL outputted from the decode circuit TD is a logical inversion signal /SEL. To output the control signal SEL as signal /SEL, an inverter (not shown) may be added to the output part of the decode circuit TD.

Power supply voltage Vcc is applied to the source of the P channel MOS transistor P4 and the signal /SEL is applied to its gate. The drain of the transistor P4 is connected to the output part of the Vref voltage generator circuit GN1 and the gates of the N channel MOS transistors N1 and N2. The signal /SEL is also applied to the Vref voltage generator circuit GN1.

In this memory system, the output of the reference voltage VrefN from the Vref voltage generator circuit GN1 is stopped by activating the signal /SEL (i.e., when it changes from "Hi" to "Low"). At this time, the P channel MOS transistor P4 enters the on state, and, as the reference voltage VrefB for burn-in test, the supply voltage Vcc is converted to signal Vref and then outputted to the N channel MOS transistors N1 and N2.

Specifically, in this memory system, the supply voltage Vcc is used as the reference voltage VrefB for burn-in test, and the P channel MOS transistor P4 functions as the switching circuit SW1 of the first preferred embodiment. In other words, it can be considered that the switching circuit SW1 of the first preferred embodiment is configured as a switching circuit SW1a that includes the P channel MOS transistor P4.

Therefore, the switching circuit SW1a can be configured easily by adding the P channel MOS transistor P4, and configuring such that the output of the reference voltage VrefN from the Vref voltage generator circuit GN1 is stopped by activating the signal /SEL, as described above. To stop the output of the reference voltage VrefN from the Vref voltage generator circuit GN1, for example, a switch (not shown) may be attached to the output part of the circuit GN1 so as to shutdown the signal output when the signal /SEL is activated.

Further, since the supply voltage Vcc is used as the reference voltage VrefB for burn-in test, the reference voltage VrefB and the pad PD2 for inputting reference voltage for burn-in test are unnecessary, thus leading to a simple circuit configuration.

Otherwise, the configuration is identical to that described with respect to the memory system of FIG. 1, and its description is therefore omitted.

Figure 5:
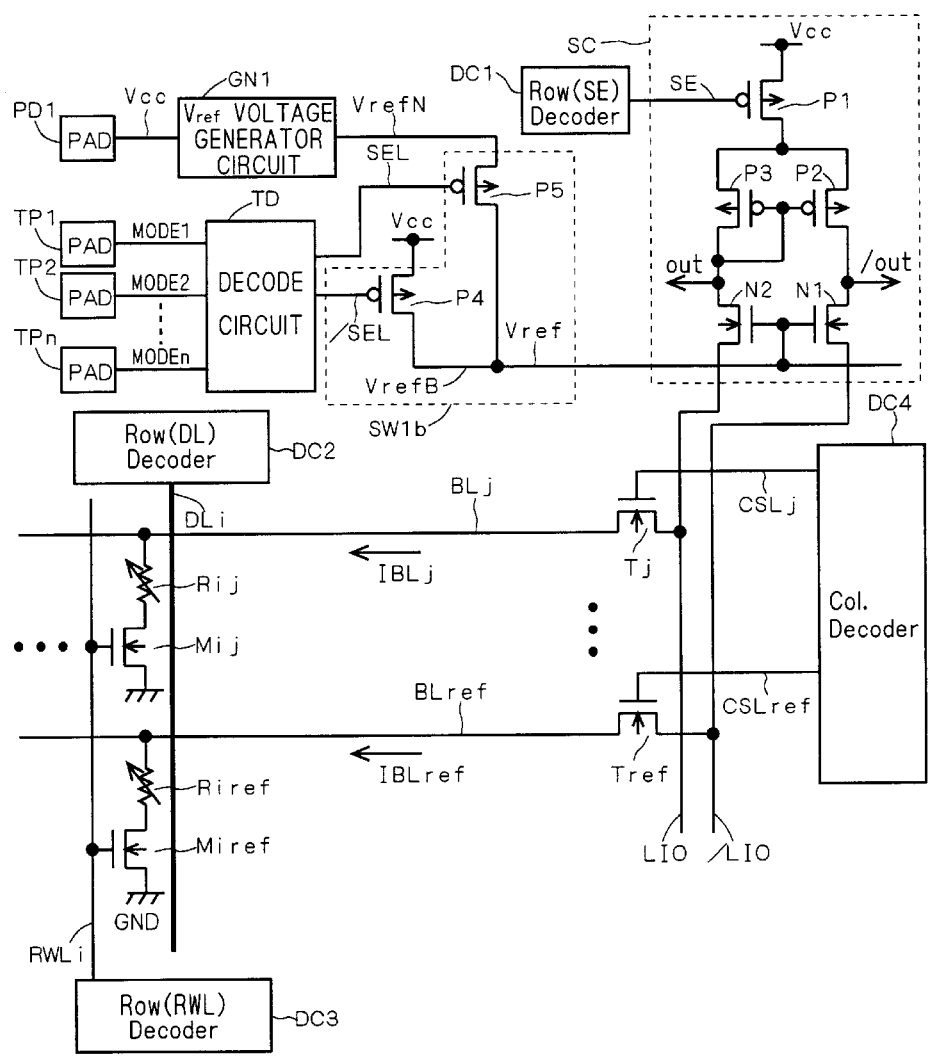
FIG. 5 is a diagram showing other memory system according to the second preferred embodiment.

FIG. 5 is a diagram showing other memory system according to the second preferred embodiment. In this memory system, a decode circuit TD outputs a control signal SEL and logical inversion signal /SEL. The memory system of FIG. 5 has a P channel MOS transistor P5, in addition to the P channel MOS transistor P4 of FIG. 4. To output the control signal SEL and logical inversion signal /SEL from the decode circuit TD, a new output part that is obtained by adding an inverter (not shown) to the output part of the control signal SEL may be disposed in addition to the original output part.

The reference voltage VrefN from the Vref voltage generator circuit GN1 is applied to the source of the P channel MOS transistor P5, and the control signal SEL is applied to its gate. The drain of the transistor P5 is connected to the drain of the P channel MOS transistor P4 and the gates of the N channel MOS transistors N1 and N2. Specifically, in this memory system, supply voltage Vcc is used as the reference voltage VrefB for burn-in test, and the P channel MOS transistors P4 and P5 function as the switching circuit SW1 of the first preferred embodiment. In other words, it can be considered that the switching circuit SW1 is configured as a switching circuit SW1b that includes the P channel MOS transistors P4 and P5.

The reason for this is as follows. When the signal /SEL is deactivated, the P channel MOS transistor P5 enters the on state and outputs reference voltage VrefN. On the other hand, when the signal /SEL is activated, the P channel MOS transistor P5 enters the off state, whereas the P channel MOS transistor P4 enters the on state and outputs the reference voltage VrefB for burn-in test.

Referring to FIG. 5, the signal /SEL is not applied to the Vref voltage generator circuit GN1, and the output of the reference voltage VrefN from the Vref voltage generator circuit GN1 is not stopped.

Thus, the switching circuit SW1 can be configured easily even by adding the P channel MOS transistors P4 and P5. Otherwise, the configuration is identical to that described with respect to the memory system of FIG. 4, and its description is therefore omitted.

Third Preferred Embodiment

A third preferred embodiment is also a modification of the memory system of the first preferred embodiment. Concretely, as switching means capable of switching between normal reference voltage VrefN and reference voltage VrefB for burn-in test, there is employed a transistor that directly applies the reference voltage VrefB for burn-in test to a memory element, without passing through any sense circuit.

Figure 6:
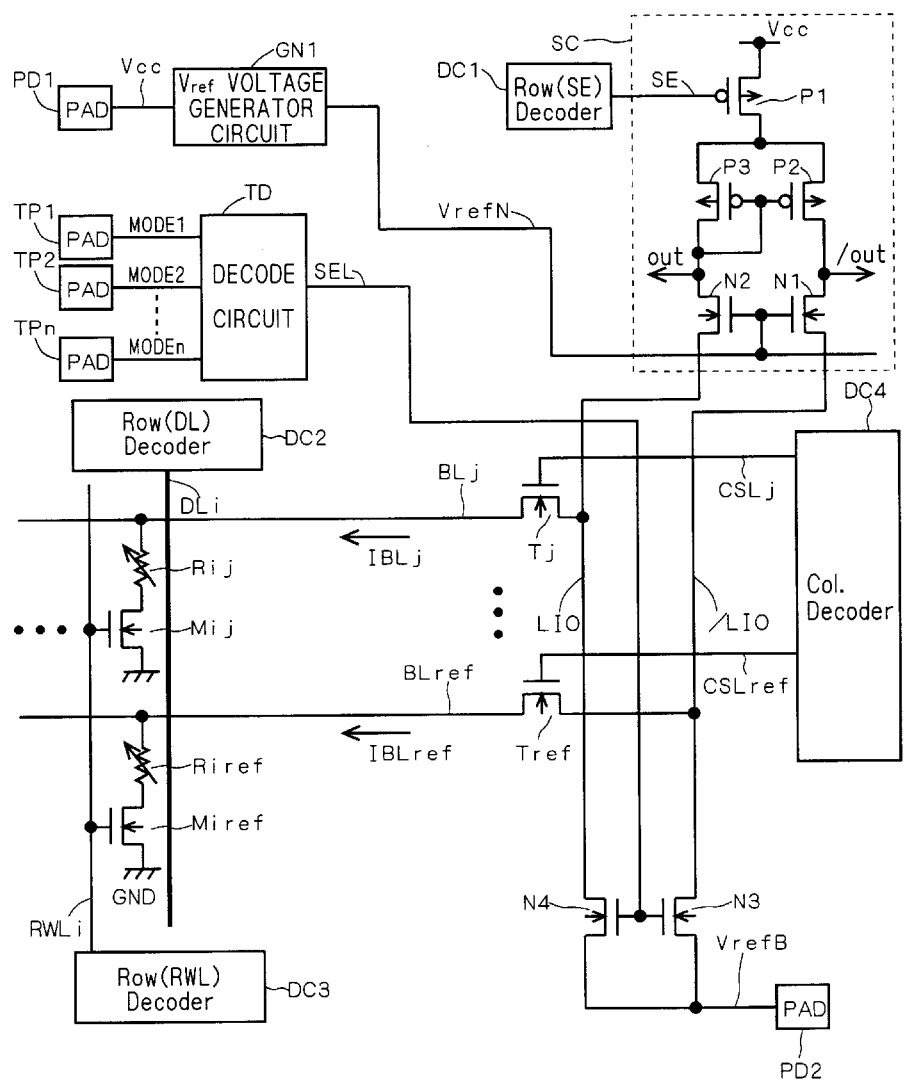
FIG. 6 is a diagram showing a memory system according to a third preferred embodiment of the invention.

FIG. 6 is a diagram showing a memory system according to the third preferred embodiment. Referring to FIG. 6, in this memory system, the switching circuit SW1 of the memory system of FIG. 1 is eliminated, and the reference voltage VrefN outputted from the Vref voltage generator circuit GN1 is directly inputted to the gates of the N channel MOS transistors N1 and N2.

In the third preferred embodiment, there is added MOS transistors N3 and N4 in which their respective gates and drains are connected to each other. The reference voltage VrefB for burn-in test is applied via a pad PD2 to the drains of the N channel MOS transistors N3 and N4. The control signal SEL from the decode circuit TD is applied to the gates of the transistors N3 and N4.

The source of the N channel MOS transistor N4 is connected to a signal line LIO that is a transfer path of signal Vref and disposed between a sense circuit SC and memory element. The source of the N channel MOS transistor N3 is connected to a signal line /LIO that is a similar transfer path.

Otherwise, the configuration is identical to that described with respect to the memory system shown in FIG. 1, and its description is therefore omitted.

In the third preferred embodiment, at the time of normal read operation, the control signal SEL from the decode circuit TD is not activated so that the N channel MOS transistors N3 and N4 do not enter the on state. In this case, the reference voltage VrefN through the sense circuit SC is applied to the memory element and reference memory element via the signal lines LIO and /LIO, N channel MOS transistors Tj and Tref, and bit lines BLj and BLref.

At the time of burn-in test, the control signal SEL from the decode circuit TD is activated so that the N channel MOS transistors N3 and N4 enter the on state. In this case, the reference voltage VrefN through the sense circuit SC and the reference voltage VrefB for burn-in test through the pad PD2 are applied to the respective sources of the N channel MOS transistors N3 and N4.

Since the reference voltage VrefB for burn-in test has a larger value than the reference voltage VrefN, instead of the reference voltage VrefN, the reference voltage VrefB for burn-in test is applied to the memory element and reference memory via the MOS transistors Tj and Tref, and bit lines BLj and BLref.

That is, in the third preferred embodiment, the N channel MOS transistors N3 and N4 form the switching means that applies either of the reference voltage VrefN and reference voltage VrefB for burn-in test to the memory element.

With the above configuration, the reference voltage VrefB for burn-in test can be applied to the memory element without passing through the sense circuit SC. Therefore, irrespective of the presence or absence of the drive of the sense circuit SC, the reference voltage VrefB for burn-in test can be reliably applied to the memory element.

Fourth Preferred Embodiment

A fourth preferred embodiment is also a modification of the memory system of the first preferred embodiment. Concretely, there is employed a variable voltage generator circuit that can generate both of reference voltage VrefN and reference voltage VrefB for burn-in test and output either of them based on the value of supply voltage Vcc. The supply voltage Vcc is used as switching means.

Figure 7:
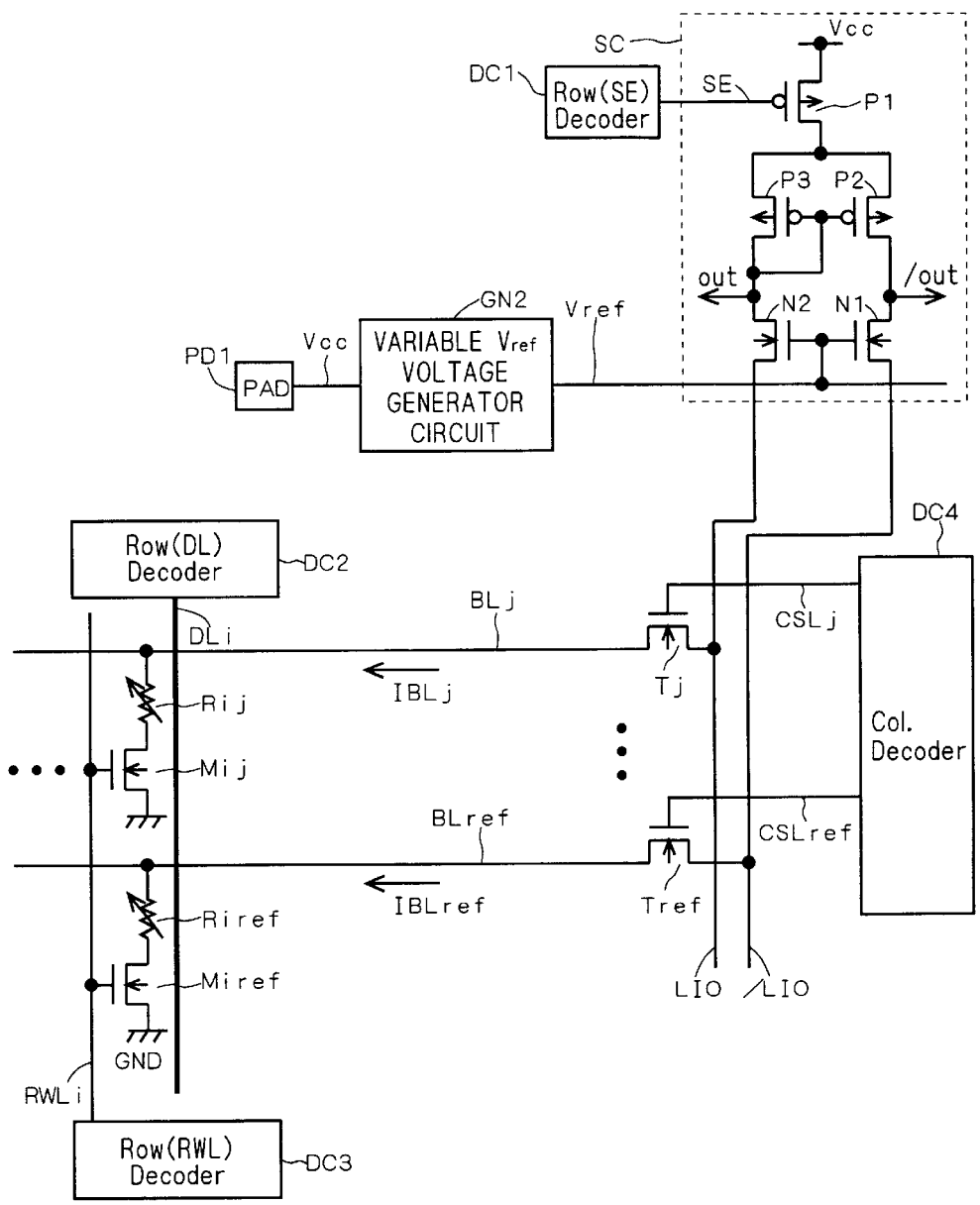
FIG. 7 is a diagram showing a memory system according to a fourth preferred embodiment of the invention.

FIG. 7 is a diagram showing a memory system of the fourth preferred embodiment. Referring to FIG. 7, in this memory system, the switching circuit SW1 and decode circuit TD in the memory system of FIG. 1 are eliminated, and the Vref voltage generator circuit GN1 is replaced with a variable Vref voltage generator circuit GN2. Signal Vref outputted from the variable Vref voltage generator circuit GN2 is directly inputted to the respective gates of N channel MOS transistors N1 and N2.

Figure 8:
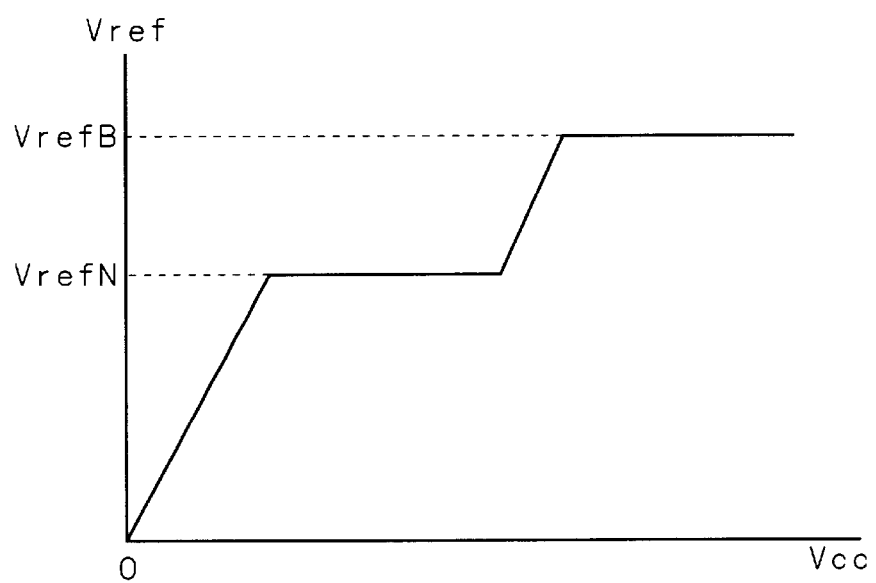
FIG. 8 is a diagram showing characteristic features of a variable Vref voltage generator circuit in the memory system of the fourth preferred embodiment.

The variable Vref voltage generator circuit GN2 is a voltage generator circuit having the characteristic features shown in FIG. 8. Specifically, based on the supply voltage Vcc inputted via a pad PD1, this circuit GN2 can generate both of reference voltage VrefN and reference voltage VrefB for burn-in test and also output either of them based on the value of the supply voltage Vcc.

Such a voltage generator circuit is known and disclosed, for example, in the literature entitled "Advanced Electronics I-9, Ultra LSI Memory" by Ito, Kiyoo, pp. 300–306, Baifukan, 1994.

Otherwise, the configuration is identical to that described with respect to the memory system shown in FIG. 1, and its description is therefore omitted.

With the memory system of the fourth preferred embodiment in which the variable Vref voltage generator circuit GN2 is employed and the supply voltage Vcc is used as switching means, the reference voltage VrefB for burn-in test can be applied to a memory element only by controlling the supply voltage Vcc. Therefore, unlike the first preferred embodiment, it is unnecessary that the control signal SEL is generated and inputted to the switching means.

Fifth Preferred Embodiment

A fifth preferred embodiment is also a modification of the memory system of the first preferred embodiment and has the characteristic feature that a current conveyor circuit implements a sense circuit.

Figure 9:
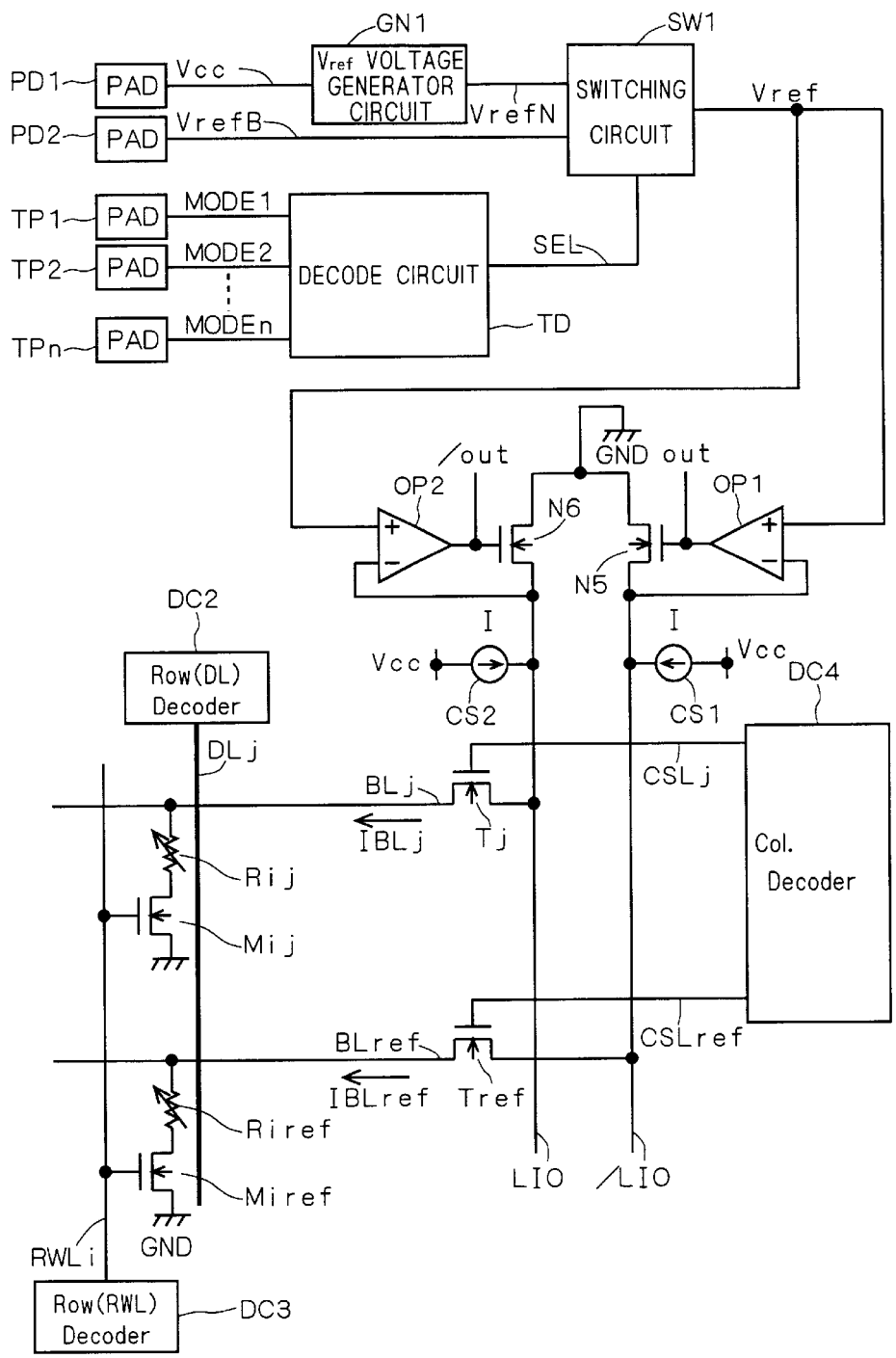
FIG. 9 is a diagram showing a memory system according to a fifth preferred embodiment of the invention.
Figure 11:
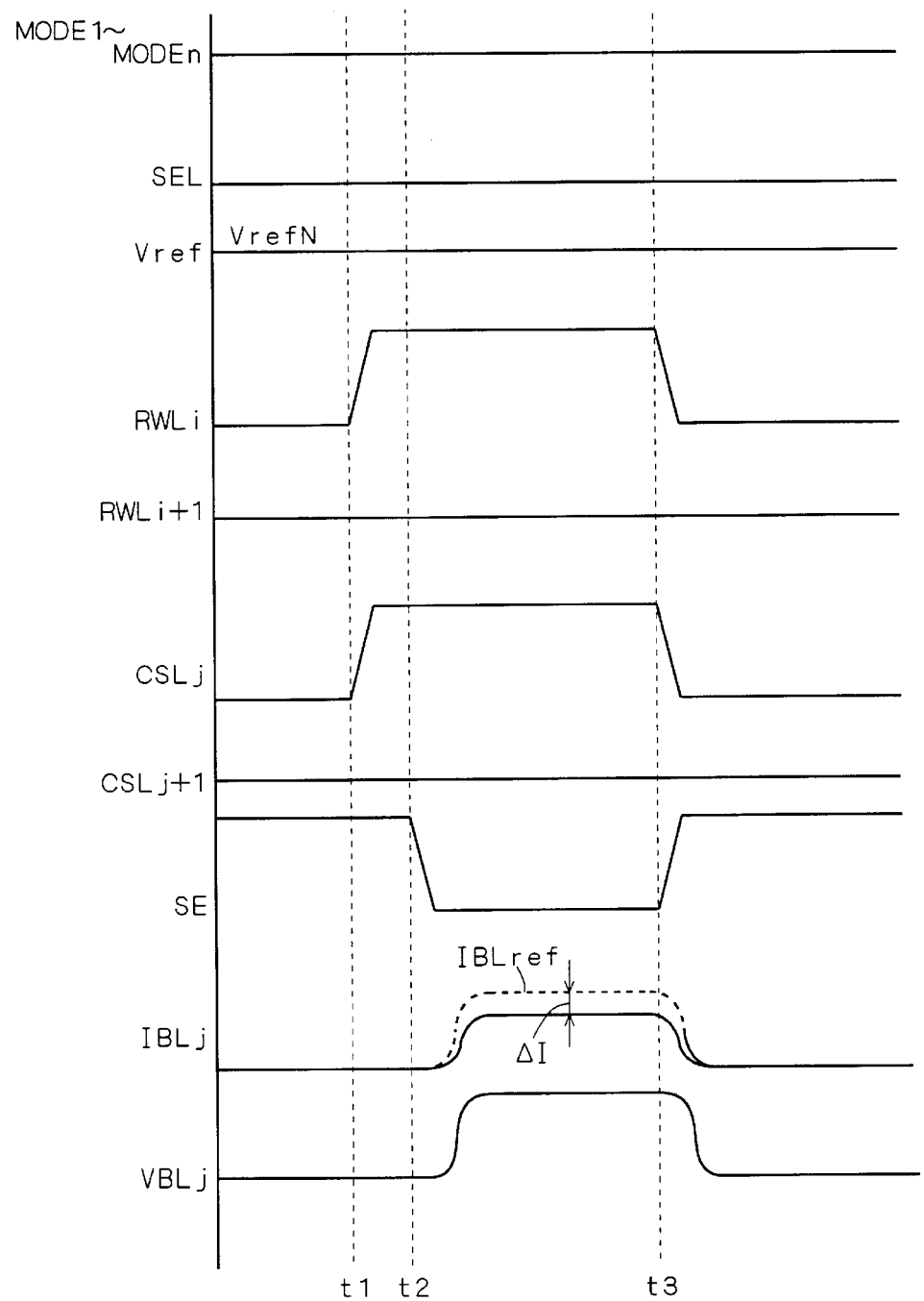
FIG. 11 is a timing chart at the time of normal read operation in the memory system of the sixth preferred embodiment.

FIG. 9 is a diagram showing a memory system of the fifth preferred embodiment. Referring to FIG. 9, this memory system employs a current conveyor circuit containing operational amplifiers OP1 and OP2, normally-on N channel MOS transistors N5 and N6, and current sources CS1 and CS2, in place of the sense circuit SC of the memory system shown in FIG. 1. The row decoder DC1 for sense circuit drive is eliminated.

In the current conveyor circuit, signal Vref from a switching circuit SW (i.e., reference voltage VrefN or reference voltage VrefB for burn-in test) is applied to the positive input terminals of the operational amplifiers OP1 and OP2. The output terminal of the operational amplifier OP1 is connected to the gate of the N channel MOS transistor N5, and the output terminal of the operational amplifier OP2 is connected to the gate of the N channel MOS transistor N6. The output terminals of the operational amplifiers OP1 and OP2 function as fetch points of voltage signals "out" and "/out".

Ground potential GND is applied in common to the sources of the N channel MOS transistors N5 and N6. The drain of the N channel MOS transistor N5 is connected to the negative input terminal of the operational amplifier OP1, and the drain of the N channel MOS transistor N6 is connected to the negative input terminal of the operational amplifier OP2. A signal line /LIO is connected to the drain of the N channel MOS transistor N5, and a signal line LIO is connected to the drain of the N channel MOS transistor N6.

The current source CS1 driven by supply voltage Vcc is connected to the drain of the N channel MOS transistor N5, and supplies constant current I. The current source CS2 driven by supply voltage Vcc is connected to the drain of the N channel MOS transistor N6, and supplies constant current I.

Otherwise, the configuration is identical to that described with respect to the memory system shown in FIG. 1, and its description is therefore omitted.

In the current conveyor circuit, the constant current I flows from the current sources CS1 and CS2. The constant current I passes through between the drain and source of the N channel MOS transistors N5 and N6, at the time of standby state that column selection lines CSLj and CSLref, and read word line RWLi are not activated.

On the other hand, when the column selection lines CSLj, CSLref, and read word line RWLi are activated to establish the readable state, the currents IBLj and IBLref pass through a memory element and reference memory element. Therefore, the value of the constant current I passing through between the drain and source of the N channel MOS transistors N5 and N6 are decreased by the amount of the currents IBLj and IBLref, respectively. Since the magnitude of this decrease appears in the voltage between the gate and source of the N channel MOS transistors N5 and N6, a difference between the currents IBLj and IBLref is converted and outputted as voltage difference of the voltage signals "out" and "/out".

In the current conveyor circuit, the signal Vref is applied to the signal lines /LIO and LIO. That is, the signal Vref is transferred to the signal lines /LIO and LIO, without causing any loss of threshold voltage Vth of the transistor. Therefore, any voltage drop on the sense circuit is not exerted on the reference voltage VrefN and reference voltage VrefB for burn-in test.

As in the memory system of the fifth preferred embodiment, the use of the current conveyor circuit as a sense circuit avoids that any voltage drop on the sense circuit is exerted on the reference voltage Vref for burn-in test.

In the current conveyor circuit of FIG. 9, (i) a circuit component consisting of the operational amplifiers OP1, N channel MOS transistor N5, and current source CS1; and (ii) a circuit component consisting of the operational amplifiers OP2, N channel MOS transistor N6, and current source CS2, are provided for memory element and reference memory element, respectively. Any number of such a circuit component may be used depending on the grouping of memory elements or the number of reference memory elements.

Sixth Preferred Embodiment

A sixth preferred embodiment is also a modification of the memory system of the first preferred embodiment and has the following characteristic feature that reference voltage VrefB for burn-in test is applied to two or more elements at a time in order to reduce the time required for burn-in test.

FIG. 10 is a diagram showing a memory system according to the sixth preferred embodiment. FIG. 10 depicts the following components, not being shown in FIG. 1, (i) a memory element composed of TMR element Ri+1j and N channel MOS transistor Mi+1j; (ii) a memory element composed of TMR element Rij+1 and N channel MOS transistor Mij+1; (iii) a memory element composed of TMR element Ri+1j+1 and N channel MOS transistor Mi+1j+1; (iv) a reference memory element composed of reference TMR element Ri+1ref and N channel MOS transistor Mi+1ref, (v) an N channel MOS transistor Tj+1; (vi) a read word line RWLi+1; (vii) a digit line DLi+1; (viii) a column selection line CSLj+1; and (ix) a bit line BLj+1.

A control signal SEL outputted from a decode circuit TD is also inputted to a read row decoder DC3 and a column decoder DC4. The reason for this is that at the time of burn-in test, two or more memory elements are simultaneously set to the readable state in order that the deterioration of failure factor is simultaneously accelerated in a plurality of memory elements.

Otherwise, the configuration is identical to that described with respect to the memory system shown in FIG. 1, and its description is therefore omitted.

FIG. 1 is a timing chart of the normal read operation in the memory system of the sixth preferred embodiment. When the logic value combination of mode change signals MODE1 to MODEn indicates the normal read mode, the control signal SEL outputted from the decode circuit TD is "Low". Thereby, a switching circuit SW1 selects a reference voltage VrefN and outputs as signal Vref to the sense circuit SC.

In the case of setting a memory element composed of TMR element Rij and N channel MOS transistor Mij to the readable state based on an address signal inputted from the exterior, at time t1, the read row decoder DC3 and column decoder DC4 set the potentials of read word line RWLi and column selection line CSLj to "Hi", respectively. As the result, there is selected a memory element locating at the intersection between the read word line RWLi and column selection line CSLj.

In this occasion, since other memory elements are not set to the readable state, the potentials of other read word lines RWLl, . . . RWLi−1, RWLi+1, . . . and column selection lines CSL1, . . . , CSLj−1, CSLj+1, . . . remain at "Low".

At time t2, the row decoder DC1 for sense circuit drive sets the control signal SE to "Low" (i.e., "Low-active") and the P channel MOS transistor P1 to the on state. Thereby, the sense circuit SC is driven to pass current through the signal lines LIO and /LIO. Then, as voltages VBLj and VBLref, the reference voltage VrefN (strictly, (VrefN−Vth−Vmc) and (VrefN−Vth) as described above) is applied to the bit lines BLj and BLref, so that currents IBLj and IBLref pass through the bit lines BLj and BLref, respectively.

The sense circuit SC converts difference ΔI between the currents IBLj and IBLref to a difference between the voltage signals "out" and "/out", and then outputs it. Thereby, the information stored in a memory element can be read.

At time t3, the read row decoder DC3 and column decoder DC4 set the potentials of the read word line RWLi and column selection line CSLj to "Low", respectively. Then, the row decoder DC1 for sense circuit drive sets the control signal SE to "Hi" and the P channel MOS transistor P1 to the off state.

Figure 12:
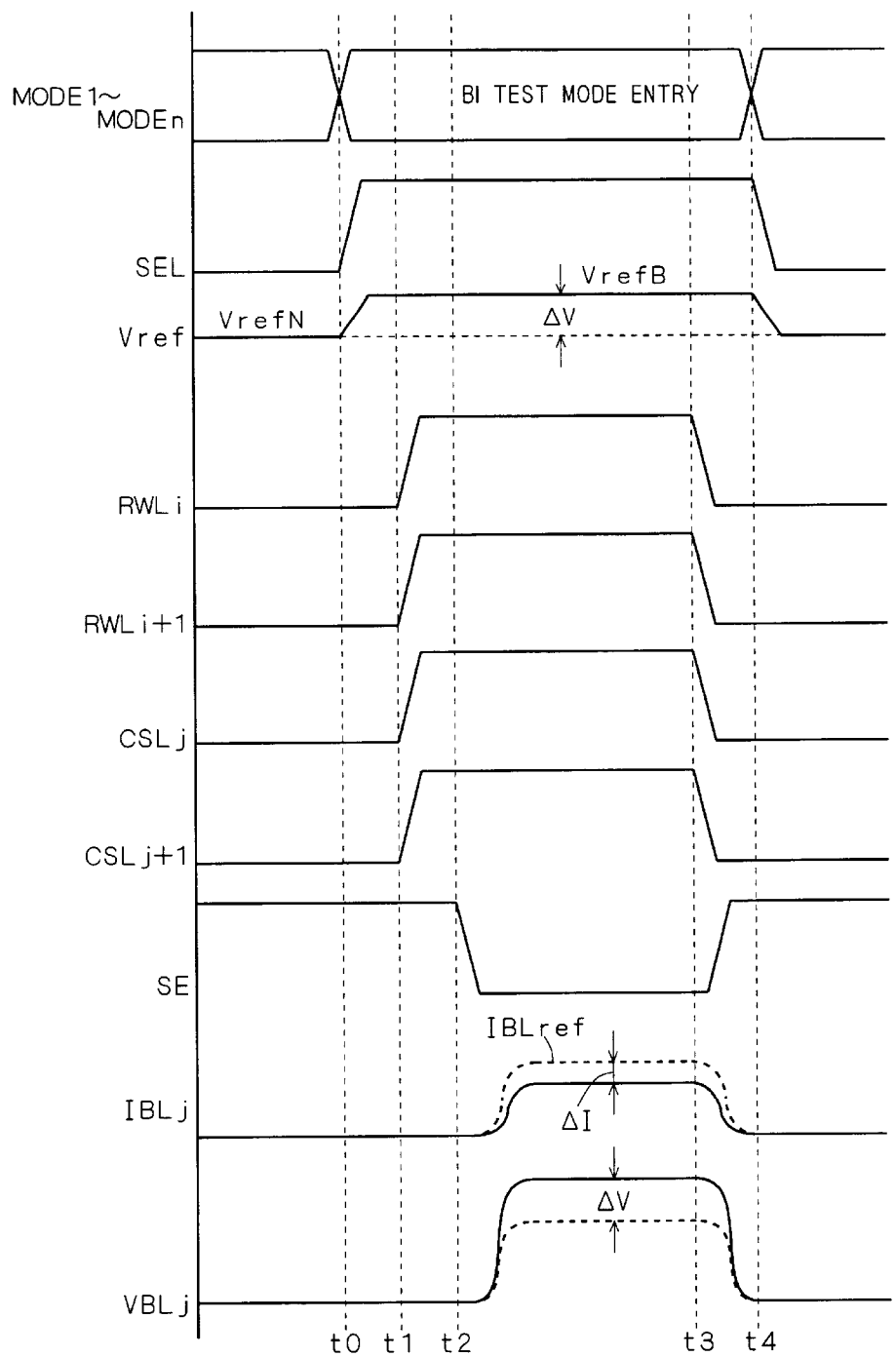
FIG. 12 is a timing chart at the time of burn-in test in the memory system of the sixth preferred embodiment.

FIG. 12 is a timing chart of the burn-in test operation in the memory system of the sixth preferred embodiment. At time to, when the logic value combination of the mode change signals MODE1 to MODEn indicates the burn-in test mode, the control signal SEL outputted from the decode circuit TD becomes "Hi". Thereby, the switching circuit SW1 selects a reference voltage VrefB for burn-in rest that is higher than the reference voltage VrefN by the amount of ΔV, and outputs it as signal Vref to the sense circuit SC.

In the sixth preferred embodiment, at the time of burn-in test, two or more memory elements are set to the readable state in order that the deterioration of failure factor is simultaneously accelerated in a plurality of memory elements at a time. For example, based on the address signal inputted from the exterior and the control signal SEL, the read row decoder DC3 and column decoder DC4 set the addressed memory elements and their surrounding memory elements in a present range to the readable state. Here, assuming that when the TMR element Rij is addressed, its surrounding TMR elements Ri+1j, Rij+1, and Ri+1j+1 are set to the readable state.

Therefore, at time t1, the read row decoder DC3 and column decoder DC4 set the potentials of the read word lines RWLi and RWLi+1, and column selection lines CSLj and CSLj+1 to "Hi", respectively. As the result, there are selected memory elements locating at the intersections between the read word lines RWLi, RWLi+1, and column selection lines CSLj, CSLj+1.

At time t2, the row decoder DC1 for sense circuit drive sets the control signal SE to "Low" and the P channel MOS transistor P1 to the on state. Thereby, the sense circuit SC is driven to pass current through the signal lines LIO and /LIO. Then, as voltages VBLj, VBLj+1, and VBLref, the reference voltage VrefB (strictly, (VrefB−Vth−Vmc) and (VrefB−Vth) as described above) is applied to the bit lines BLj, BLj+1, and BLref, so that currents IBLj, IBLj+1, and IBLref pass through the bit lines BLj, BLj+1, and BLref, respectively.

In this occasion, the reference voltage VrefB for burn-in test having a larger value than the reference voltage VrefN for normal read operation is applied to the memory element and reference memory element. It is therefore possible to properly perform the burn-in test.

At time t3, the read row decoder DC3 and column decoder DC4 set the potentials of the read word line RWLi, RWLi+1, and column selection lines CSLj and CSLj+1 to "Low", respectively. Then, the row decoder DC1 for sense circuit drive sets the control signal SE to "Hi" and the P channel MOS transistor P1 to the off state.

At time t4, when the logic value combination of the mode change signals MODE1 to MODEn indicates the termination of the burn-in test, the control signal SEL outputted from the decode circuit TD returns to "Low." Thereby, the switching circuit SW1 selects the reference voltage VrefN, instead of the reference voltage VrefB for bur-in test.

With the memory system of the sixth preferred embodiment, the reference voltage VrefB for burn-in test is applied at a time to at least two of a plurality of memory elements contained in the MRAM, thereby reducing the time required for burn-in test.

Others

The foregoing first to sixth preferred embodiments have described that the present invention is applicable to the MRAM. While the present invention is generally applicable to memory systems that are memory systems operated by supply voltage and of a type which is unaffected by supply voltage variations over a predetermined range and applies to a memory element a predetermined reference voltage for reading multi-valued information recorded in the memory element.

In particular, the present invention is suitable for a memory system that has a sense circuit for reading multi-valued information recorded in a memory element and of a type in which a reference voltage is applied via a sense circuit to the memory element, and the memory element generates a current signal on receipt of the reference voltage, and the sense circuit reads the multi-valued information based on the current signal. The MRAM is a typical representative example of such a memory system.

While the invention has been shown and described in detail, the foregoing description is in all aspects illustrative and not restrictive. It is therefore understood that numerous modifications and variations can be devised without departing from the scope of the invention.

What is claimed is:

1. A memory system comprising:
   a plurality of memory elements;
   a voltage generator circuit generating a reference voltage that is a voltage having a predetermined value used for reading information stored in said memory elements and that is unaffected by supply voltage variations over a predetermined range; and
   a switching unit configured to switch between the state of applying said reference voltage to at least one of said memory elements and the state of applying, instead of said reference voltage, a reference voltage for burn-in test having a larger value than said reference voltage.

2. The memory system according to claim 1 wherein said switching unit includes a switching circuit that receives as inputs said reference voltage and said reference voltage for burn-in test, and outputs either of them based on the contents of a predetermined control signal.

3. The memory system according to claim 2 wherein said switching circuit includes a first transistor having a control electrode to which said predetermined control signal is inputted, a first current electrode to which said reference voltage for burn-in test is applied, and a second current electrode functioning as output of said switching circuit.

4. The memory system according to claim 3 wherein said switching circuit further includes a second transistor having a control electrode to which a logical inversion signal of said predetermined control signal is inputted, a first current electrode to which said reference voltage is applied, and a second current electrode functioning as output of said switching circuit.

5. The memory system according to claim 1 wherein said supply voltage is used as said reference voltage for burn-in test.

6. The memory system according to claim 1 further comprising:
   a sense circuit reading information stored in said memory elements, wherein
   said reference voltage is applied via said sense circuit to said at least one of memory elements,
   said at least one of memory elements generate a current signal on receipt of said reference voltage application, and
   said sense circuit reads information stored in said memory elements based on said current signal.

7. The memory system according to claim 6 wherein said memory elements includes a TMR (tunneling magnet-resistance) element.

8. The memory system according to claim 6 further comprising:
   a signal line that functions as a transfer path of said reference voltage and is disposed between said sense circuit and at least one of said memory elements, wherein
   said switching unit includes a transistor having a control electrode to which a predetermined control signal is inputted, a first current electrode to which said reference voltage for burn-in test is applied, and a second current electrode connected to said signal line.

9. The memory system according to claim 6 wherein said reference voltage for burn-in test is also applied via said sense circuit to said at least one of memory elements, and
   said sense circuit is a current conveyor circuit having a circuit component comprising:
   an operational amplifier having a negative input terminal, a positive input terminal to which said reference voltage or said reference voltage for burn-in test is applied, and an output terminal;
   a transistor having a control electrode connected to said output terminal, a first current electrode to which a predetermined potential is applied, and a second current electrode connected to said negative input terminal; and
   a current source that is connected to said second current electrode and capable of supplying current to said memory elements.

10. The memory system according to claim 1 wherein said voltage generator circuit is a variable voltage generator circuit that generates both of said reference voltage and said reference voltage for burn-in test based on said supply voltage, and that can output either of said reference voltage or said reference voltage for burn-in test depending on the value of said supply voltage, and said switching unit is said supply voltage.

11. The memory system according to claim 1 wherein said reference voltage for burn-in test is applied to at least two of said plurality of memory elements at a time.

12. A memory system comprising:

a plurality of memory elements;

a voltage generator circuit generating a first reference voltage that is a voltage having a predetermined value used for reading information stored in said memory elements; and a switching unit configured to switch between the state of applying said first reference voltage to at least one of said memory elements and the state of applying, instead of said first reference voltage, a second reference voltage having a different value fron said first reference voltage.

13. A memory system comprising:

a plurality of memory elements;

a signal line connected to a sense circuit reading information stored in said memory elements; and a switching unit configured to switch between the state of applying a first reference voltage to at least one of said memory elements through said signal line from said sense circuit and the state of applying, instead of said first reference voltage, a second reference voltage having a larger value than said first reference voltage through said signal line from another pass than said sense circuit, wherein said memory elements include a TMR (tunneling magnet-resistance) element.

* * * * *